United States Patent
Grodzki et al.

(10) Patent No.: US 10,185,007 B2
(45) Date of Patent: Jan. 22, 2019

(54) NOISE REDUCTION DURING SELECTIVE MR EXCITATION

(71) Applicant: Siemens Aktiengesellschaft, Munich (DE)

(72) Inventors: David Grodzki, Erlangen (DE); Kuan Jin Lee, Singapore (SG); Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 509 days.

(21) Appl. No.: 14/925,083

(22) Filed: Oct. 28, 2015

(65) Prior Publication Data

US 2016/0116558 A1    Apr. 28, 2016

(30) Foreign Application Priority Data

Oct. 28, 2014 (DE) .......................... 10 2014 221 950

(51) Int. Cl.
*G01R 33/54* (2006.01)
*G01R 33/483* (2006.01)
*G01R 33/385* (2006.01)

(52) U.S. Cl.
CPC ...... *G01R 33/4833* (2013.01); *G01R 33/3854* (2013.01)

(58) Field of Classification Search
None
See application file for complete search history.

(56) References Cited

U.S. PATENT DOCUMENTS

| | | | | |
|---|---|---|---|---|
| 6,075,363 | A * | 6/2000 | Sellers | F16F 1/3615 324/318 |
| 9,547,062 | B2 * | 1/2017 | Grodzki | G01R 33/56572 |
| 9,632,160 | B2 * | 4/2017 | Grodzki | G01R 33/543 |
| 9,678,188 | B2 * | 6/2017 | Grodzki | G01R 33/56 |
| 2004/0061499 | A1 * | 4/2004 | Stocker | G01R 33/3854 324/318 |
| 2004/0113619 | A1 * | 6/2004 | Schuster | G01R 33/3854 324/318 |
| 2005/0127911 | A1 | 6/2005 | Magland et al. | |
| 2010/0052678 | A1 * | 3/2010 | Heid | G01R 33/54 324/309 |
| 2013/0060126 | A1 * | 3/2013 | Greiser | A61B 5/055 600/410 |

(Continued)

OTHER PUBLICATIONS

Pauly et al, Parameter Relations for the Shinnar-Le Roux Selective Excitation Pulse Design Algorithm, Mar. 1991, IEEE Transactions on Medical, vol. 10, pp. 53-65.*

(Continued)

*Primary Examiner* — Jermele M Hollington
(74) *Attorney, Agent, or Firm* — Schiff Hardin LLP

(57) ABSTRACT

In a method and magnetic resonance apparatus for creating an optimizing pulse sequence for selective RF excitation in the magnetic resonance apparatus, the pulse sequence has an excitation event block, which has an RF pulse and a selection gradient. Nuclear spins are excited in a predefined volume section in a predetermined manner by this excitation event block, which is designed to so that the spins inside the volume section have the same phase position after the excitation event block of the pulse sequence. The selection gradient does not have a polarity reversal.

12 Claims, 3 Drawing Sheets

(56) References Cited

U.S. PATENT DOCUMENTS

| | | | |
|---|---|---|---|
| 2014/0062481 A1* | 3/2014 | Greiser | G01R 33/56366 |
| | | | 324/309 |
| 2014/0232397 A1* | 8/2014 | Grodzki | G01R 33/543 |
| | | | 324/309 |
| 2015/0198685 A1* | 7/2015 | Grodzki | G01R 33/32 |
| | | | 324/309 |
| 2015/0323631 A1 | 11/2015 | Asslaender et al. | |
| 2016/0231408 A1* | 8/2016 | Kannengiesser | G01R 33/4828 |
| 2017/0003362 A1* | 1/2017 | Kuratani | G01R 33/3854 |
| 2017/0199259 A1* | 7/2017 | Beck | G01R 33/4835 |
| 2018/0017646 A1* | 1/2018 | Feiweier | G01R 33/4822 |

OTHER PUBLICATIONS

Roberts et al., "A Simple Method for the Construction of 180° Refocusing RF Pulses for Use in Nuclear Magnetic Resonance Imaging," Journal of Magnetic Resonance, Series B 101, pp. 78-82 (1993).

* cited by examiner

NOISE REDUCTION DURING SELECTIVE MR EXCITATION

BACKGROUND OF THE INVENTION

Field of the Invention

The present invention concerns a method and apparatus for reducing the noises that occur during selective radio-frequency (RF) excitation in the acquisition of magnetic resonance (MR) data.

Description of the Prior Art

Current MR examinations are usually very loud. Depending on the type of examination and scanner, noise levels of much greater than 100 db(A) may occur, so the patient being examined has to wear hearing protection.

The main cause of the high noise level of an MR examination is the rapid switching of gradients during the examination. High noise levels occur if the timing of the pulse sequence used is very short, and high gradient moments are required. As an example in the case of slice excitation, according to the prior art the polarity of the corresponding slice selection gradient is reversed directly after a selective RF excitation so as to compensate a gradient moment that has accumulated during the RF excitation. This is also known as rephasing. In most applications, high slew rates (dG/dt) and gradient amplitudes are required for rephasing, and this results in a high noise generation.

SUMMARY OF THE INVENTION

An object of the present invention is to reduce noise generation during selective RF excitation.

This object is achieved in accordance with the present invention by a method for creating a pulse sequence for selective RF excitation for a magnetic resonance system. The inventive method includes the following steps.

A predetermined volume section is specified in which nuclear spins are to be excited with the magnetic resonance system in a predetermined manner (for example defined by the flip angle).

The pulse sequence is created, which includes an excitation event block for selective RF excitation. The excitation event block includes an RF excitation pulse and at least one selection gradient. The pulse sequence is created such that only spins in the predetermined volume section are excited in the predetermined manner by the excitation event block, and so that the spins inside the volume section have the same phase position directly after the excitation event block. The pulse sequence, or more precisely the excitation event block, is therefore created such that any phase dispersion of the excited spins that occurs during RF excitation is compensated by the selection gradient, or does not occur in the first place, so the spins inside the volume section have the same phase position directly at the end of the excitation event block (in particular at the end of the selection gradient).

The at least one selection gradient does not have a polarity reversal.

Since, according to the prior art, switching the polarity of the selection gradient is the main cause of noise emission, noise emission can be significantly reduced compared to the prior art by the pulse sequence created according to the invention.

The present invention also encompasses a method for optimizing a pulse sequence for selective RF excitation for a magnetic resonance system. The inventive method includes the following steps.

The pulse sequence is specified which includes an excitation event block to produce selective RF excitation of nuclear spins in the subject. The excitation event block includes an RF excitation pulse and at least one selection gradient. With the predefined pulse sequence (more precisely, with the excitation event block) only the spins in a predetermined volume section are excited in a predetermined manner (for example defined by the flip angle).

The pulse sequence is optimized, so with the excitation event block of the optimized pulse sequence similarly only the spins in the same volume section are excited in the same manner and after the excitation event block of the optimized pulse sequence have the same phase position as would be the case with the excitation event block of the non-optimized pulse sequence. In contrast to a non-optimized pulse sequence, the at least one selection gradient of the optimized pulse sequence does not have a polarity reversal, however.

In contrast to the previously-described inventive method for creating a pulse sequence, in the inventive method for optimizing a predefined pulse sequence, the predefined pulse sequence is optimized such that the at least one selection gradient of the optimized pulse sequence no longer has a polarity reversal. In addition to the advantage of significant noise reduction, the inventive method for optimizing a pulse sequence has the advantage that a completely calculated pulse sequence is optimized according to the invention without other settings of the pulse sequence that is to be optimized, such as settings for reading out the raw data, for switching further gradients (for example flux compensation gradients, diffusion gradients) being changed.

In other words, in the case of the inventive optimization the excitation event block responsible for the RF excitation, or part of the pulse sequence, is replaced by an excitation event block, which excites the same volume section in the same manner (for example flip angle) as the excitation event block that is to be replaced or optimized. The duration of the optimized excitation event block should also match the duration of the excitation event block to be replaced since then no further changes are required (to the source code) of the actual pulse sequence. In other words, in the inventive optimization of a completely calculated pulse sequence only the excitation event block is replaced, without other parameters, such as the sequence timing, having to be changed.

Inhomogeneities in the basic magnetic field (B0 field) can be detected for example in the preliminary stage, and then be taken into account when creating or optimizing the pulse sequence.

Inhomogeneities in the basic magnetic field can be caused for example by the magnetic resonance system itself or by the examination object to be examined. Since these inhomogeneities are taken into account during creation or optimization of the pulse sequence, the quality of the MR data acquired with the respective pulse sequence can be improved.

In a similar manner, inhomogeneities in the B1 field, which are caused by a transmitting antenna or the examination object, are detected and taken into account when creating or optimizing the pulse sequence.

As in the case of consideration of the inhomogeneities of the basic magnetic field, the quality of the MR data acquired by the pulse sequence can be improved by consideration of the inhomogeneities in the B1 field. Since the inventively created RF excitation pulses are generally susceptible to B1 inhomogeneities, consideration of B1 inhomogeneities is important during generation or optimization of the pulse sequence.

The present invention also enables the simultaneous use of a multiple transmitting antennas. In this case the pulse sequence for each of these transmitting antennas is individually created or individually optimized.

The simultaneous use of a number of transmitting antennas can increase the flexibility in the RF excitation and reduce exposure to radiation (SAR) of the patient, particularly in the case of magnetic resonance systems that operate at high field strengths (>3 tesla).

In a similar manner, a number of receiving antennas can also be used simultaneously according to the invention. In this case the pulse sequence is advantageously created or optimized such that after the pulse sequence the phases of the spins in the volume section have a distribution that facilitates and thereby optimizes the simultaneous detection of MR data with the multiple receiving antennas.

In other words, the phase position of the spins at the end of the excitation event block of the inventive pulse sequence is not the same inside the volume section, and instead has a predetermined distribution with which the simultaneous acquisition of the MR data with the multiple receiving antennas is optimized or at least improved.

According to a preferred inventive embodiment the pulse sequence is created or optimized with a Shinnar-Le Roux algorithm.

Starting from specific requirements (for example the flip angle, no polarity reversal of the selection gradient) of the RF excitation to be attained, the pulse sequence that is to be created or optimized is determined or calculated with the use of the Shinnar-Le Roux algorithm. The Shinnar-Le Roux algorithm simplifies the solution to the Bloch equations in order to create or optimize the pulse sequence such that the specific requirements are met. An RF pulse of this kind generated with the use of the Shinnar-Le Roux algorithm can be a minimum phase Shinnar-Le Roux pulse.

The present invention also encompasses a method for acquiring MR data in a predetermined volume section of an examination object with a magnetic resonance system. The inventive method includes the following steps.

A pulse sequence is executed that has an excitation event block for generating an RF excitation. The excitation event block has an RF excitation pulse and at least one selection gradient applied at the same time as the RF excitation pulse in order to excite only spins in the volume section.

MR data are then acquired in the pulse sequence. The RF excitation pulse and the at least one selection gradient are configured such that the spins inside the volume section have the same phase position at the end of the excitation event block. Furthermore, the at least one selection gradient does not have a polarity reversal.

Regardless of which inventive method is used, the at least one selection gradient can be switched off (deactivated) directly at the end of the RF excitation pulses.

With this variant, the RF excitation pulse and the at least one selection gradient are designed such that the spins have the same phase position or are focused as early as at the end of the RF excitation pulse, so the at least one selection gradient can or must be switched off as early as at the end of the RF excitation pulse. An RF excitation pulse used in this variant is in particular a self-focusing RF pulse.

According to the invention it is also possible, however, that the at least one selection gradient (or at least one selection gradient) is only switched off a certain period after the end of the RF excitation pulse. With this variant the last portion of the at least one selection gradient can in particular be used for refocusing or rephasing the spins.

In other words, according to the invention either no rephasing can be used (if the RF pulse is self-focusing) or rephasing is used, wherein the rephasing gradient has the same polarity as the selecting gradient, wherein here the gradient called the selection gradient takes on both the selecting and rephasing tasks.

Regardless of which inventive method is used, the predetermined volume section can be only exactly one slice, or a number of slices that are excited at the same time with the same RF excitation pulse, or a volume section or slab, which has a thickness that is greater than the thickness of a slice.

Furthermore, within the context of the present invention a method for operating a magnetic resonance system is provided, wherein either a pulse sequence is created with the inventive method described above, or wherein a pulse sequence is optimized with the inventive method described above. The magnetic resonance system is operated with the created or optimized pulse sequence.

In the present invention, a selective RF excitation occurs with a pulse sequence, which has an excitation event block, having an RF excitation pulse and (at least) one selection gradient, which is applied at the same time as the RF excitation pulse, and wherein the selection gradient does not have a polarity reversal. The present invention has the following aspects that have been described above in detail:

Creating an appropriate pulse sequence.
Optimizing an appropriate pulse sequence.
Acquiring MR data with an appropriate pulse sequence.
Operating a magnetic resonance system with an appropriate pulse sequence.

Due to the non-existence (absence) of a polarity reversal of the selection gradient, the noise generation of the magnetic resonance system can be significantly reduced compared to the prior art, of the inventive pulse sequence. For the same reasons the mechanical loading of the scanner hardware is reduced and patient stimulation effects reduced.

Within the context of the present invention a device is also provided for creating a pulse sequence for selective RF excitation for a magnetic resonance system. The inventive device has an input interface and a computer. The input interface is configured to specify, in the computer, a predetermined volume section and a predetermined manner in which spins are to be excited in the predetermined volume section. The computer is configured to create the pulse sequence so as to have an excitation event block that includes an RF excitation pulse and at least one selection gradient, such that only the spins in the volume section are excited in the predetermined manner and that the spins inside the volume section all have the same phase position (i.e. no phase dispersion) at the end of the excitation event block. The at least one selection gradient does not have a polarity reversal.

Furthermore, within the context of the present invention a device for optimizing a pulse sequence is provided for selective RF excitation for a magnetic resonance system. This device for optimizing also has an input interface, an analysis processor and computer. The input interface is configured to specify a pulse sequence, which again has an excitation event block, having an RF excitation pulse and at least one selection gradient. The analysis processor is configured to ascertain properties of the RF excitation of the pulse sequence (for example the position of the volume section and in which manner the excitation occurs) as a function of the pulse sequence (in particular as a function of the excitation event block). The computer is configured to optimize the pulse sequence such that the ascertained properties are met with the excitation event block of the optimized pulse sequence, so only the spins in the volume section are excited in the ascertained manner and so that the spins have the same phase position (i.e. no phase dispersion) at the end of the excitation event block of the optimized pulse sequence. The at least one selection gradient does not have a polarity reversal.

According to the invention a magnetic resonance apparatus for acquiring MR data in a predetermined volume section of an examination object is also provided. The magnetic resonance system has a scanner that has a basic field magnet, gradient field system, at least one RF antenna, and a controller that controls the gradient field system and the at least one RF antenna, for receiving measuring signals received from the at least one RF antenna and for creating the MR data. The magnetic resonance scanner is operated by the controller to apply a pulse sequence, which has an excitation event block, having an RF excitation pulse and at least one selection gradient applied at the same time as the RF excitation pulse to thereby only excite spins in the volume section, and to then acquire the MR data. The spins inside the volume section have the same phase position (i.e. no phase dispersion) at the end of the excitation event block of the pulse sequence. The selection gradient does not have a polarity reversal.

The inventive devices and the inventive magnetic apparatus have the advantages as the corresponding inventive methods, which have been described above in detail.

The present invention also encompasses a non-transitory, computer-readable data storage medium that can be loaded into a memory of a programmable controller or an arithmetic processor of a magnetic resonance apparatus. All or various embodiments of the inventive methods described above can be carried out by programming instructions encoded in the storage medium, when these instructions are executed in the controller or control computer of the magnetic resonance apparatus. The programming instructions may require program peripherals, for example libraries and help functions, to implement the corresponding embodiments of the methods. The programming instructions can be in source code (for example C++), which has still to be compiled and embedded or which only has to be interpreted, or in an executable software code that for execution, then only has to be loaded in the corresponding arithmetic unit or controller.

The electronically readable data carrier can be, for example a DVD, magnetic tape, hard disk or a USB stick, on which electronically readable control information, in particular software (cf. above), is stored.

According to the invention the pulse sequence or the interplay between the RF excitation pulse and the at least one selection gradient can be designed such that either no rephasing is required or that rephasing is indeed required, but this can be carried out with the at least one selection gradient, without the at least one selection gradient having to reverse its polarity or change its sign for this purpose (i.e. the polarity of the at least one selection gradient is the same during RF excitation and during rephasing). The gradient activity can be significantly reduced, and the volume level lowered therefore, by using an inventive pulse sequence of this kind. On the other hand, it is also conceivable that shorter timing or a shorter time response (compared to the prior art where the polarity of the gradients changes) is enabled with an inventive pulse sequence of this kind, whereby, for example, shorter echo times are possible.

DESCRIPTION OF THE PREFERRED EMBODIMENTS

Figure 1:
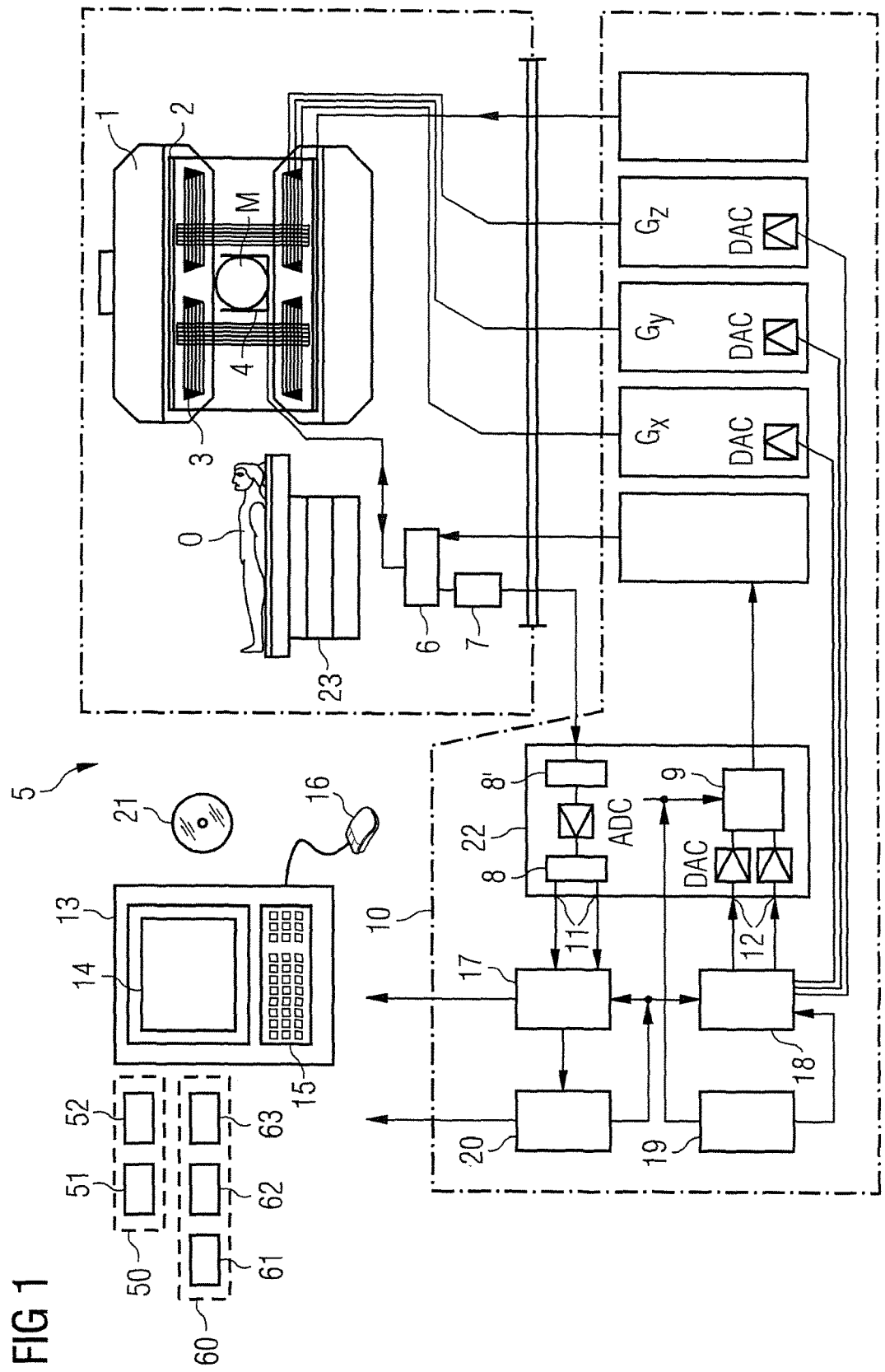
FIG. 1 schematically illustrates an inventive magnetic resonance system having two inventive devices.

FIG. 1 schematically shows an inventive magnetic resonance scanner 5 (of a magnetic resonance imaging or nuclear spin tomography device) and an inventive device 50 for creating a pulse sequence and an inventive device 60 for optimizing a pulse sequence. A basic field magnet 1 of the magnetic resonance scanner 5 generates a strong magnetic field, which is constant over time, for polarization or alignment of the nuclear spins in an examination region of an object O, such as part of a human body that is to be examined. The object O is moved continuously while lying on a table 23 into the magnetic resonance scanner 5. The high homogeneity of the basic magnetic field required for the nuclear spin resonance measurement is defined in a typically spherical measuring volume M, through which the parts of the human body to be examined are continuously moved. Shim plates made from ferromagnetic material are provided at suitable locations for facilitating the homogeneity requirements and in particular for eliminating effects that are invariable over time. Effects that are variable over time are eliminated by shim coils 2.

A cylindrical gradient field system or gradient field system 3 is provided to the basic field magnet 1. The gradient field system 4 has three sub-windings. Each sub-winding is supplied by an amplifier with current for generating a linear gradient field (which can also change over time) in the respective directions of the Cartesian coordinate system. The first sub-winding of the gradient field system 3 generates a gradient $G_x$ in the x direction, the second sub-winding a gradient $G_y$ in the y direction and the third sub-winding a gradient $G_z$ in the z direction. Each amplifier has a digital-analog converter that is activated by a sequence controller 18 for correctly timed generation of gradient pulses.

Inside the gradient field system 3 there is one or more radio-frequency antennas 4 which convert the radio-frequency pulses emitted by a radio-frequency power amplifier into a magnetic alternating field for excitation of the nuclei and alignment of the nuclear spins of the object O to be examined, or of the region of the object O to be examined. Each radio-frequency antenna 4 has one or more RF transmitting coil(s) and one or more RF receiving coil(s) in the form of an annular, preferably linear or matrix-type, arrangement of component coils. The alternating field issuing from the precessing nuclear spins, (usually the nuclear spin echo signals caused by a pulse sequence from one or more radio-frequency pulses and one or more gradient pulses), is also converted by the RF receiving coils of the respective radio-frequency antenna 4 into a voltage (measuring signal) which is fed by an amplifier 7 to a radio-frequency receiving channel 8 of a radio-frequency system 22. The radio-frequency system 22, which is part of a controller 10 of the magnetic resonance scanner 5, also has a transmitting channel 9 in which the radio-frequency pulses are generated for the excitation of the nuclear magnetic resonance. The respective radio-frequency pulses are digitally represented in the sequence controller 18 as a sequence of complex numbers on the basis of a pulse sequence predefined by the system computer 20. This sequence of numbers is fed as real and imaginary parts via respect inputs 12 to a digital-analog converter in the radio-frequency system 22, and from this to a transmitting channel 9. In the transmitting channel 9 the pulse sequences are modulated to a radio-frequency carrier signal whose base frequency matches the resonance frequency of the nuclear spins in the measuring volume.

The changeover between transmitting and receiving mode occurs via a diplexer 6. The RF transmitting coils of the radio-frequency antennas 4 radiate the radio-frequency pulses for excitation of the nuclear spins into the measuring volume M and resulting echo signals are sampled by the RF receiving coil(s). The accordingly obtained nuclear resonance signals are demodulated in receiving channel 8' (first demodulator) of the radio-frequency system 22 in a phase-sensitive manner to an intermediate frequency, digitized in the analog-digital converter (ADC) and output via the output 11. This signal is then demodulated to the frequency 0. Demodulation to the frequency 0 and the separation into real and imaginary parts take place after digitization in the digital domain in a second demodulator 8. An MR image is reconstructed by an image computer 17 from the measurement data obtained in this way. The measurement data, image data and control programs are administered by the system computer 20. The sequence controller 18 controls the generation of the pulse sequences desired in each case and the corresponding sampling of k-space on the basis of a stipulation using control programs. In particular, the sequence controller 18 controls the correctly timed switching of the gradients, the emission of the radio-frequency pulses with defined phase amplitude, and receipt of the magnetic resonance signals. The time base for the radio-frequency system 22 and the sequence controller 18 is supplied by a synthesizer 19. The choice of appropriate control programs for generation of an MR image, which are stored for example on a DVD 21, and displaying of the generated MR image occurs at a terminal 13, which has a keyboard 15, a mouse 16 and a screen 14.

The inventive magnetic resonance scanner 5 has a device 50 for creating the pulse sequence, and a device 60 for optimizing the pulse sequence. The inventive device 50 has an input interface 51, with which the predetermined volume section and a predetermined manner in which spins are to be excited with the pulse sequence in the predetermined volume section, can be specified, and a computer 52. The pulse sequence, which includes an excitation event block, having an RF excitation pulse and at least one selection gradient, is created with the computer 52. The computer 52 create the pulse sequence and in particular the excitation event block such that only the spins in the volume section are excited in the predetermined manner (e.g. with a predetermined flip angle), and such that the spins inside this volume section have the same phase position at the end of the excitation event block, and such that the at least one selection gradient does not have a polarity reversal.

The device 60 for optimizing a pulse sequence has an input interface 61, an analysis processor 62 and a computer 63. The input interface 61 is configured to accept a pulse sequence that is actually completely ready to be emitted, but yet to be optimized, and pass it to the analysis processor 62. The analysis processor 62 is configured to ascertain specific properties (e.g. the position and dimensions of the volume section to be excited, the flip angle) of the pulse sequence to be optimized and relay them to the computer 62. The computer 62 then optimize the pulse sequence as a function of these properties such that the optimized pulse sequence excites only the spins inside the volume section in the ascertained manner, with the spins having the same phase position at the end of the excitation event block of the optimized pulse sequence and with the at least one selection gradient of the optimized pulse sequence not having a polarity reversal.

Figure 2:
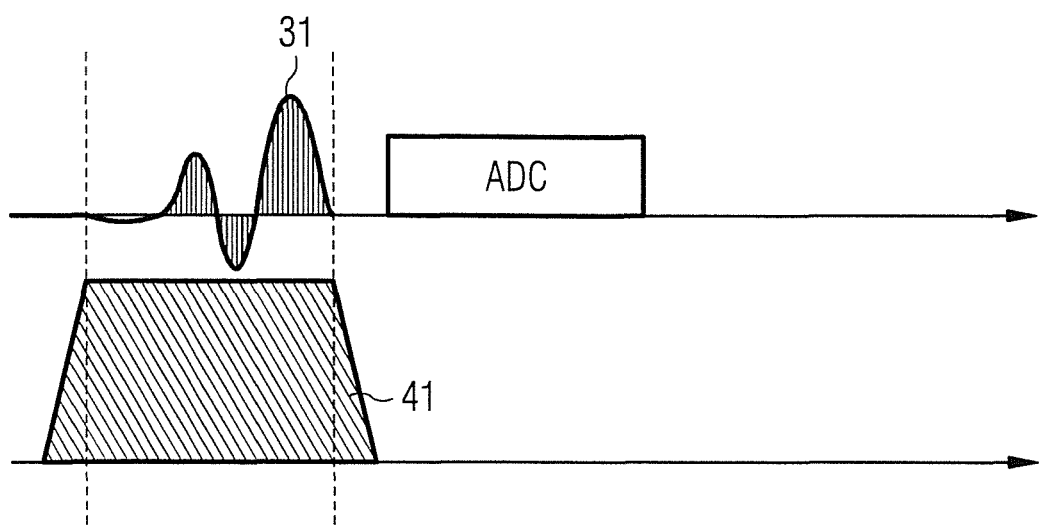
FIGS. 2 and 3 each show an inventive pulse sequence diagram for spatially selective excitation.

FIG. 2 shows a first inventive pulse sequence that has an RF excitation pulse 31 and a slice selection gradient 41 (as components of an excitation event block of the pulse sequence). To create this pulse sequence the slice to be excited (as the volume section to be excited) and the flip angle are specified to a Shinnar-Le Roux algorithm. Furthermore, it has been specified to the Shinnar-Le Roux algorithm that the slice selection gradient 41 firstly must not have a polarity reversal and that, secondly, the slice selection gradient 41 should be switched off at the end of the RF excitation pulse 41. Starting from these specifications the RF excitation pulse 31 shown in FIG. 2 and the slice selection gradient 41 that is to be applied at the same time as the RF excitation pulse 31 were then calculated with the aid of the Shinnar-Le Roux algorithm. The specification that the gradient 41 should be switched off at the end of the RF excitation pulse matches the specification that the RF excitation pulse 31, in cooperation with the gradient 41, must be a self-focusing RF pulse.

Figure 3:
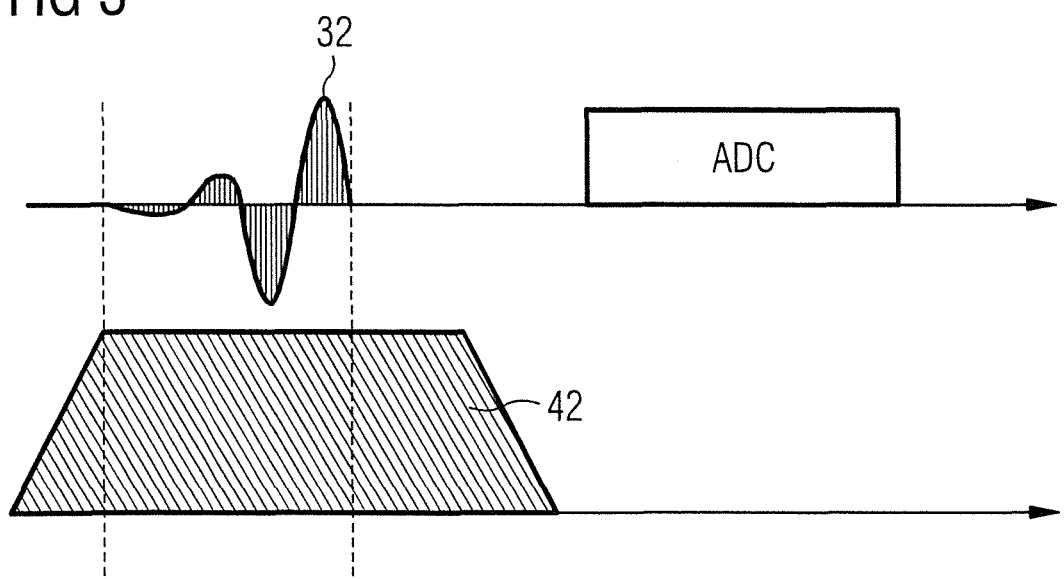

FIG. 3 shows a second inventive pulse sequence that has an RF excitation pulse 32 and a slice selection gradient 42 (as components of an excitation event block of the pulse sequence). This pulse sequence was also calculated with the aid of the Shinnar-Le Roux algorithm from the specifications of the position and dimensions of the slice to be excited, the flip angle and the requirement for no polarity reversal of the slice selection gradient 42. In contrast to the pulse sequence in FIG. 2 it was permissible this time for the slice selection gradient 42 to remain active beyond the end of the RF excitation pulse 32. As a result, the portion of the slice selection gradient 42, which is active after the RF excitation pulse 32, can be used for rephasing or refocusing (i.e. for compensation of the phase dispersion that occurred due to the slice selection). For this reason the gradient 42 shown in FIG. 3 is actually only partly a slice selection gradient and partly (the part after the RF pulse) a rephasing gradient.

In the FIGS. 2 and 3 the reference character ADC in each case denotes acquisition of the MR data.

Figure 4:
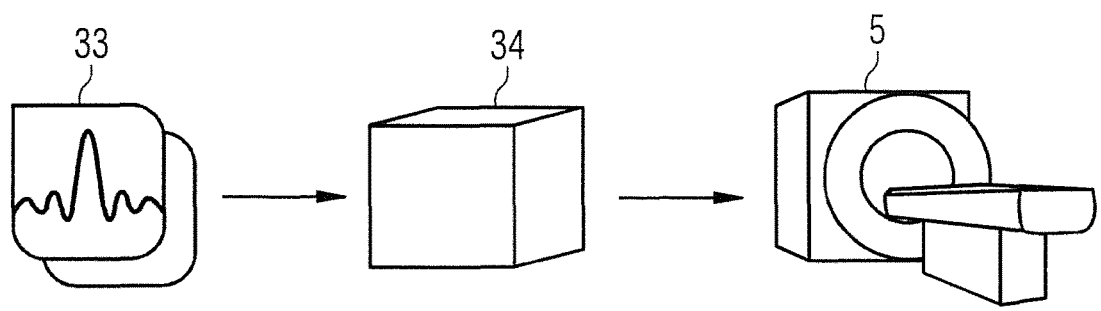
FIG. 4 schematically shows the inventive procedure for optimization of a pulse sequence.

FIG. 4 shows an inventive optimization of a pulse sequence.

A pulse sequence 33, as is used according to prior art for slice selection or slab selection, is subjected to an optimization 34 before the optimized pulse sequence is used in a magnetic resonance scanner 5. The optimization can optimize a pulse sequence ready for employment such that the optimized pulse sequence excites the same volume section in the same manner as the output pulse sequence, wherein the optimized pulse sequence does not have a polarity reversal in the case of a selection gradient.

Figure 5:
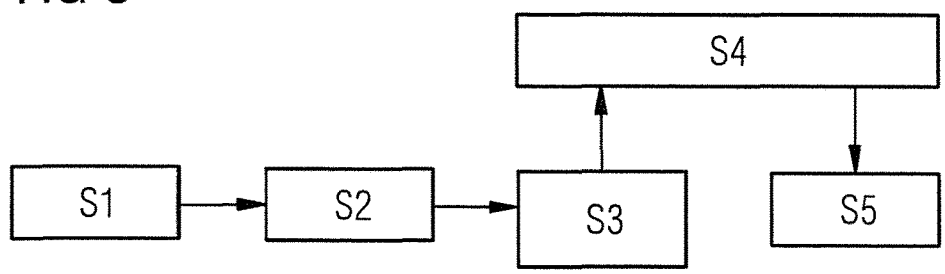
FIG. 5 is a flowchart of the inventive method for optimizing a pulse sequence.

Inventive optimizing of a pulse sequence is shown again in FIG. 5 in the form of a flow diagram. In a first step S1 a pulse sequence is conventionally prepared. In the process inter alia the sequence type is determined or an appropriate protocol is chosen in which a specific sequence type is defined. In this step S1 the required parameters are adopted, or optionally changes are made to these parameters by a user. In the subsequent step S2 the exact timing and the course of the pulse sequence with the predetermined defined sequence parameters are then calculated. Step S3 following step S2 ascertains excitation event blocks inside the pulse sequence, with each excitation event block comprising an RF excitation pulse and the associated at least one slice or slab selection gradient. For the actual optimization the pulse sequence, in which the excitation event blocks are ascertained, is optimized in step S4 in that the RF excitation pulse and the at least one selection gradient of the respective excitation event block are replaced with the aid of the Shinnar-Le Roux algorithm by an RF excitation pulse and at least one selection gradient matched to this RF excitation pulse, wherein the at least one selection gradient does not have a polarity reversal. The RF excitation pulse created in step S4 and the at least one selection gradient is created with the aid of the Shinnar-Le Roux algorithm to develop exactly the same effect as the respective excitation event block, ascertained in step S4, of the pulse sequence to be optimized. The part of the pulse sequence, which does not match an excitation event block, can therefore remain unchanged.

The optimized pulse sequence is, in step S5, emitted in a form for operating the magnetic resonance scanner 5.

The present invention is implemented only in step S4. If the present invention is not used, the pulse sequence generated in steps S1 to S3 is employed in step S5 by means of the magnetic resonance scanner 5 without passing through step S4. In other words, without the invention, step S5 directly follows step S3.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a pulse sequence for operating a magnetic resonance (MR) scanner, comprising:
   providing an input to a processor that specifies a predetermined volume section of an examination object in which nuclear spins are to be excited in a predetermined manner;
   in said processor, automatically generating a pulse sequence in a form for operating said MR scanner, said pulse sequence comprising an excitation event block in which a radio-frequency (RF) pulse is radiated and a selection gradient is activated that causes only nuclear spins in said predetermined volume section to be excited in said predetermined manner by said excitation event block, with nuclear spins within said volume section having a same phase position after said excitation event block, and wherein said selection gradient has no polarity reversal after being activated; and
   making said pulse sequence available from said processor as an electronic signal for controlling said MR scanner.

2. A method as claimed in claim 1 wherein said MR scanner, during execution of said pulse sequence, generates a basic magnetic field exhibiting a basic magnetic field inhomogeneity, and comprising providing an input to said processor representing said basic magnetic field inhomogeneity, and creating said pulse sequence by taking said basic magnetic field inhomogeneity into account.

3. A method as claimed in claim 1 wherein said MR scanner comprises an RF radiator that radiates said RF pulse in said pulse sequence to produce an RF field, and wherein said RF field exhibits an RF field inhomogeneity dependent on said RF radiator and said examination object, and providing an input to said processor that represents said RF field inhomogeneity, and creating said pulse sequence by taking said RF field inhomogeneity into account.

4. A method as claimed in claim 1 wherein said MR scanner comprises a plurality of RF radiators, and comprising generating said pulse sequence individually for each of said RF radiators.

5. A method as claimed in claim 1 wherein said MR scanner comprises a plurality of RF reception antennas that each receive RF signals resulting from said excitation of said nuclear spins, and comprising generating said pulse sequence to distribute the phase of the nuclear spins in the volume section to optimize simultaneous acquisition of said RF signals with said plurality of reception antennas.

6. A method as claimed in claim 1 comprising generating said pulse sequence by executing a Shinnar-Le Roux algorithm in said processor.

7. A method as claimed in claim 1 comprising generating said pulse sequence to cause said selection gradient to be deactivated at an end of said RF pulse.

8. A method as claimed in claim 1 comprising designating said predetermined volume section from the group consisting of exactly one slice, a plurality of slices that are excited simultaneously with said RF pulse, and a volume section having a thickness that is greater than a thickness of a slice.

9. A method for operating a magnetic resonance (MR) scanner to acquire MR data comprising:
   providing an input to a processor that specifies a predetermined volume section of an examination object in which nuclear spins are to be excited in a predetermined manner;
   in said processor, automatically generating a pulse sequence in a form for operating said MR scanner, said pulse sequence comprising an excitation event block in which a radio-frequency (RF) pulse is radiated and a selection gradient is activated that causes only nuclear spins in said predetermined volume section to be excited in said predetermined manner by said excitation event block, with nuclear spins within said volume section having a same phase position after said excitation event block, and wherein said selection gradient has no polarity reversal after being activated; and
   providing said pulse sequence from said processor to a control computer of said MR scanner, and controlling said MR scanner from said control computer according to said pulse sequence to acquire MR data from the examination object.

10. A device for generating a pulse sequence for operating a magnetic resonance (MR) scanner, comprising:
    a processor;
    an input of said processor configured to receive a designation of a processor predetermined volume section of an examination object in which nuclear spins are to be excited in a predetermined manner;
    said processor being configured to automatically generate a pulse sequence in a form for operating said MR scanner, said pulse sequence comprising an excitation event block in which a radio-frequency (RF) pulse is radiated and a selection gradient is activated that causes only nuclear spins in said predetermined volume section to be excited in said predetermined manner by said excitation event block, with nuclear spins within said volume section having a same phase position after said excitation event block, and wherein said selection gradient has no polarity reversal after being activated; and
    said processor being configured to make said pulse sequence available from said processor as an electronic signal for controlling said MR scanner.

11. A magnetic resonance (MR) apparatus comprising:
    an MR scanner comprising a radio-frequency (RF) radiator and a gradient coil system;

a processor provided within a predetermined volume section of an examination object in which nuclear spins are to be excited in a predetermined manner;

said processor being configured to automatically generate a pulse sequence in a form for operating said MR scanner, said pulse sequence comprising an excitation event block in which an RF pulse is radiated and a selection gradient is activated that causes only nuclear spins in said predetermined volume section to be excited in said predetermined manner by said excitation event block, with nuclear spins within said volume section having a same phase position after said excitation event block, and wherein said selection gradient has no polarity reversal after being activated; and said processor being configured to control said MR scanner according to said pulse sequence with said RF pulse being radiated by said RF radiator and said selection gradient being activated by said gradient coil system.

12. A non-transitory, computer-readable data storage medium encoded with programming instructions, said storage medium being loaded into a control computer of a magnetic resonance (MR) apparatus comprising an MR scanner, and said programming instructions causing said control computer to:

receive a predetermined volume section of an examination object in which nuclear spins are to be excited in a predetermined manner;

automatically generate a pulse sequence in a form for operating said MR scanner, said pulse sequence comprising an excitation event block in which a radio-frequency (RF) pulse is radiated and a selection gradient is activated that causes only nuclear spins in said predetermined volume section to be excited in said predetermined manner by said excitation event block, with nuclear spins within said volume section having a same phase position after said excitation event block, and wherein said selection gradient has no polarity reversal after being activated; and make said pulse sequence available from said control computer as an electronic signal for controlling said MR scanner.

* * * * *